United States Patent
Sung et al.

(10) Patent No.: US 6,344,997 B2
(45) Date of Patent: Feb. 5, 2002

(54) SPLIT-GATE FLASH CELL FOR VIRTUAL GROUND ARCHITECTURE

(75) Inventors: Hung-Cheng Sung, Hsin-chu; Din-Son Kuo, Hsin chu; Chia-Ta Hsieh, Tainan; Yai-Fen Lin, Hsin-chu, all of (TW)

(73) Assignee: Taiwan Semiconductor Manufacturing Company, Hsin-chu (TW)

( * ) Notice: Subject to any disclaimer, the term of this patent is extended or adjusted under 35 U.S.C. 154(b) by 0 days.

(21) Appl. No.: 09/858,527

(22) Filed: May 17, 2001

Related U.S. Application Data

(62) Division of application No. 09/396,519, filed on Sep. 15, 1999, now Pat. No. 6,249,454.

(51) Int. Cl.$^7$ .............................................. G11C 16/04
(52) U.S. Cl. ........................... 365/185.18; 365/185.28; 365/185.29
(58) Field of Search ....................... 365/185.18, 185.14, 365/185.16, 185.26, 185.28, 185.29

(56) References Cited

U.S. PATENT DOCUMENTS

| | | | |
|---|---|---|---|
| 5,067,108 A | 11/1991 | Jeng | 365/185 |
| 5,278,439 A * | 1/1994 | Ma et al. | 257/319 |
| 5,440,158 A | 8/1995 | Sung-Mu | 257/314 |
| 5,508,955 A | 4/1996 | Zimmer et al. | 365/185.16 |
| 5,670,809 A * | 9/1997 | Saitoh | 257/316 |
| 5,714,412 A * | 2/1998 | Liang et al. | 438/266 |
| 5,838,618 A | 11/1998 | Lee et al. | 365/185.29 |
| 5,986,934 A * | 11/1999 | Kao et al. | 365/185.18 |
| 6,097,059 A * | 8/2000 | Yamada | 257/321 |
| 6,204,530 B1 * | 3/2001 | Choi | 257/315 |

\* cited by examiner

*Primary Examiner*—Michael Lebentritt
*Assistant Examiner*—Anh Phung
(74) *Attorney, Agent, or Firm*—George O. Saile; Stephen B. Ackerman

(57) ABSTRACT

In this invention bit lines are ion implanted into a semiconductor substrate in columns beside floating gates of an array of flash memory cells. A control gate overlays each row floating gates and operates as a word lines for the rows of flash memory cells. Each bit line serves a dual purpose of providing a drain for one cell and a source for the adjacent cell. The flash memory cells are programmed, erased and read depending upon the voltages applied to the buried bit lines and the word line structured as a control gate that extends the length of each row. By implanting the bit lines into the semiconductor substrate the flash memory cell can be made smaller improving the density of the flash memory.

9 Claims, 4 Drawing Sheets

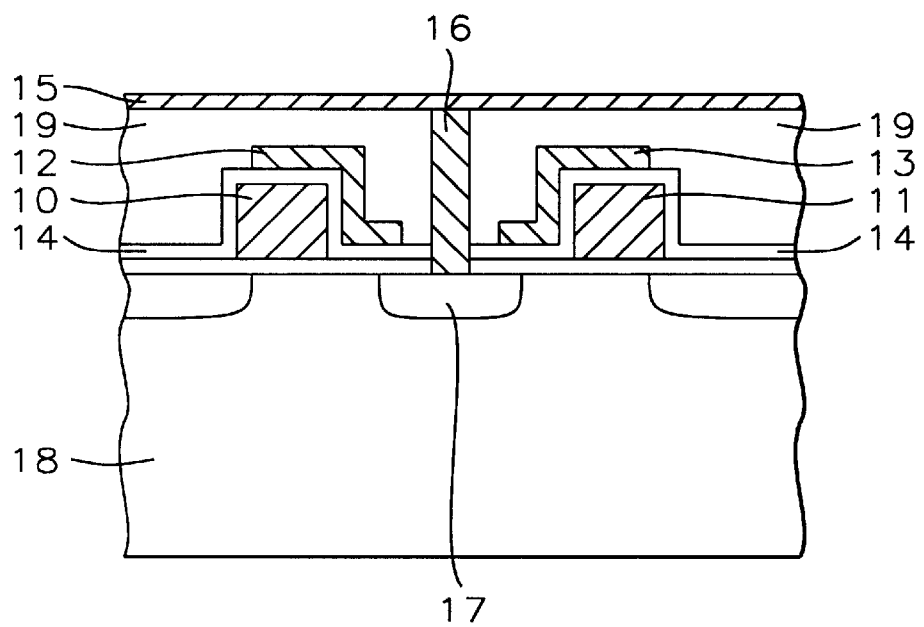
FIG. 1 - Prior Art
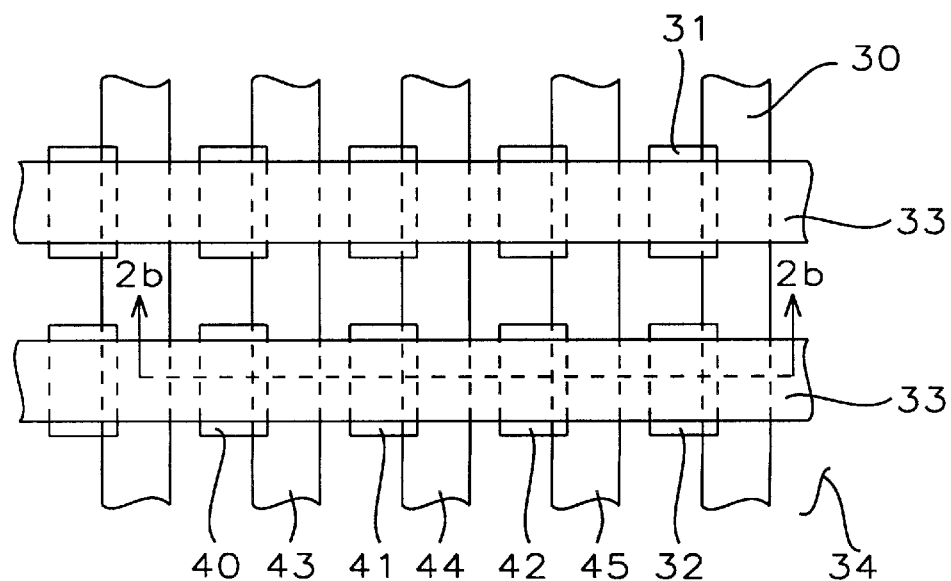
FIG. 2a

| | VOLTAGES | | | | |
|---|---|---|---|---|---|
| | CONTROL GATE | BL1 | BL2 | BL3 | SUBSTRATE |
| PROG. CELL 2 (FG-2) | 7 | 0 | 3 | FLT | 0 |
| PROG. CELL 3 (FG-3) | 7 | FLT | 0 | 3 | 0 |
| ERASE CELLS 1,2,3 | 0 | 8 | 8 | 8 | 0 |
| READ CELL 2 (FG-2) | 3 | 2 | 0 | 0 | 0 |
| READ CELL 3 (FG-3) | 3 | 0 | 2 | 0 | 0 |

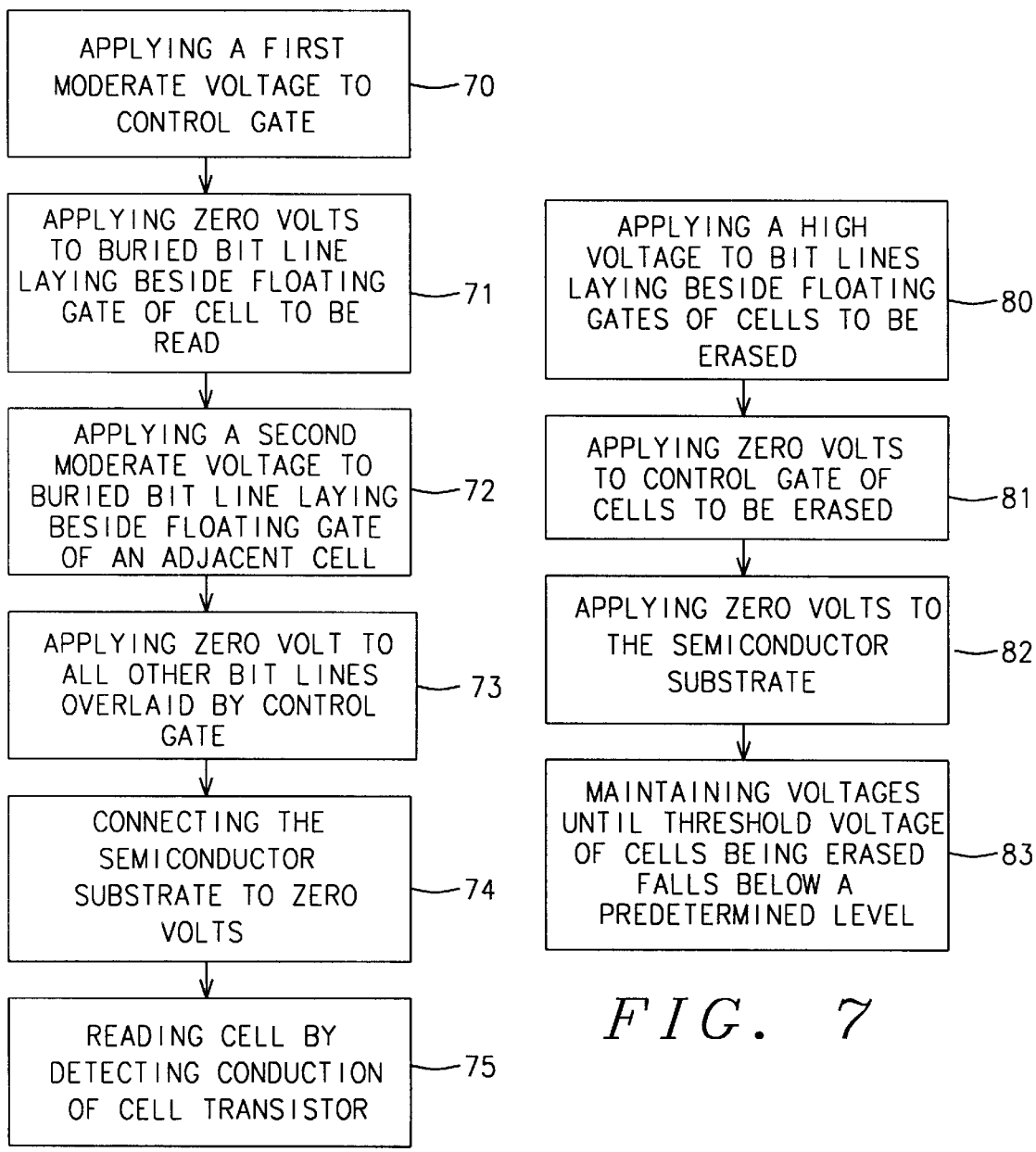

SPLIT-GATE FLASH CELL FOR VIRTUAL GROUND ARCHITECTURE

This is a division of patent application Ser. No. 09/396,519, filing date Sep. 15, 1999 now U.S. Pat. No. 6,249,454 issued on Jun. 14, 2002 assigned to the same assignee as the present invention.

BACKGROUND OF THE INVENTION

1. Field of Invention

This invention relates to semiconductor memories and in particular split gate flash memory cells

2. Description of Related Art

Split gate flash memory technology requires a relatively large cell size compared to other type memory technologies. This is in part caused by misalignment problems and not being able to take advantage of self alignment techniques. Some designs of flash memory cells have multiple storage bits per each memory cell to accommodate the increased demand storage density, but this usually comes with an increased program current.

In U.S. Pat. No. 5,838,618 (Lee et al.) a method is disclosed to erase data from a flash EEPROM while electrical charges trapped in the tunneling oxide are eliminated to maintain separation of the programmed and erased thresholds. In U.S. Pat. No. 5,508,995 (Zimmer et al.) is described a split gate EPROM cell with buried bit lines on either side of a storage cell. The source for the EPROM cell is in part a buried bit line on one side of the storage cell and the drain is in part a buried bit line on the other side of the cell In U.S. Pat. No. 5,440,158 (Sung-Mu) is shown an EPROM cell with dual sidewall floating gates. Source and drain regions are formed between and on either side of the floating gates and a control gate is formed over the floating gates. In U.S. Pat. No. 5,067,108 (Jenq), an electrically conductive re-crystallized floating gate is disposed over an insulating area extending over a portion of a channel region and a drain region. A control gate partially overlaps the floating gate and extends over a portion of a source region.

With the demands for increased density for flash memory chips, it is important to create a small cell size that can be easy to shrink. The demand for increased density will require a solution to the misalignment problem in conventional split gate flash memories, and the minimizing of requirements for metalization and contact areas. To deal with the density requirement a cell architecture is required that has floating gates with source and drain areas that are in part a portion of buried bit lines and a control gate that extends beyond the cell to form in part a word line for the flash memory. Doing these items of improvement can produce an architecture for a split gate flash memory cell that will allow the cell to be reduced in size producing a higher flash memory density.

SUMMARY OF THE INVENTION

In this invention bit lines for a flash memory are ion implanted into a semiconductor substrate. The bit lines lay beside and extend partially under each column of floating gates and run the length of each column. A control gate is formed over each row of floating gates and runs the length of each row. The control gate of each row of floating gates serves as a word line for that row. Combinations of voltages applied to a control gate overlaying a row of floating gates and to bit lines on either side of a floating gate in that row, allow the floating gate to be programmed, read and erased.

This invention is a virtual ground architecture since a bit line acts as a drain for floating gates on one side of the bit line with Vcc being applied and acts as a source for floating gates on the opposite side of the bit line with zero volts being applied.

Bit lines are alternately used as drains and sources as spit gate transistors are formed between adjacent columns. A bit line physically associated with a first column of floating gates and separated from a second column by a channel length in the semiconductor substrate is a source for the split gate transistors formed between the first and second columns of floating gates. A bit line physically associate with the second column and partially laying under the floating gates of the second column is the drain for the split gate transistors formed between the first and second columns. In like manner, the bit line physically associated with the second column and spaced by a channel length from the floating gate of a third column is a source for the split gate transistors formed between the second and third columns. The buried bit line physically associated with the third column is the drain for the split gate transistors formed between the second and third columns.

A flash memory cell comprises a floating gate with a buried bit line extending partially under the floating gate, a buried bit line from an adjacent column separated from the floating gate by a portion of a channel length, and a control gate running the length of the row containing the floating gate. The flash memory cell is programmed by applying a high voltage to the control gate, a moderate voltage to the bit line lay beside and extending partially under the floating gate, and applying zero volts to the bit line in the adjacent column. Electrons flowing from the bit line of the adjacent column gain energy as they flow through the channel between the two bit lines and are injected into the floating gate caused by impact ionization in the channel. The floating gate is erased by applying a high voltage to the surrounding bit lines and zero volts to the control gate. The erasure that removes electrons from the floating gate is done by means of Fowler-Nordheim tunneling from the floating gate and the bit line partially extending under the floating gate. The floating gate is read by applying a moderate voltage to the control gate, applying a moderate voltage of lower magnitude than that applied to the control gate to the buried bit line from the adjacent column and applying zero volts to the buried bit line partially extending under the floating gate being read.

BRIEF DESCRIPTION OF THE DRAWINGS

This invention will be described with reference to the accompanying drawings, wherein:

FIG. 1 is a cross sectional view of a split gate flash memory cell of prior art, FIG. 2a is a plan view of a portion of the flash memory cells of this invention, FIG. 6 is a flow diagram for reading a flash memory cell of this invention, and FIG. 7 is a flow diagram for erasing a flash memory cell of this invention.

DETAILED DESCRIPTION OF THE PREFERRED EMBODIMENT

Figures 2B, 3:
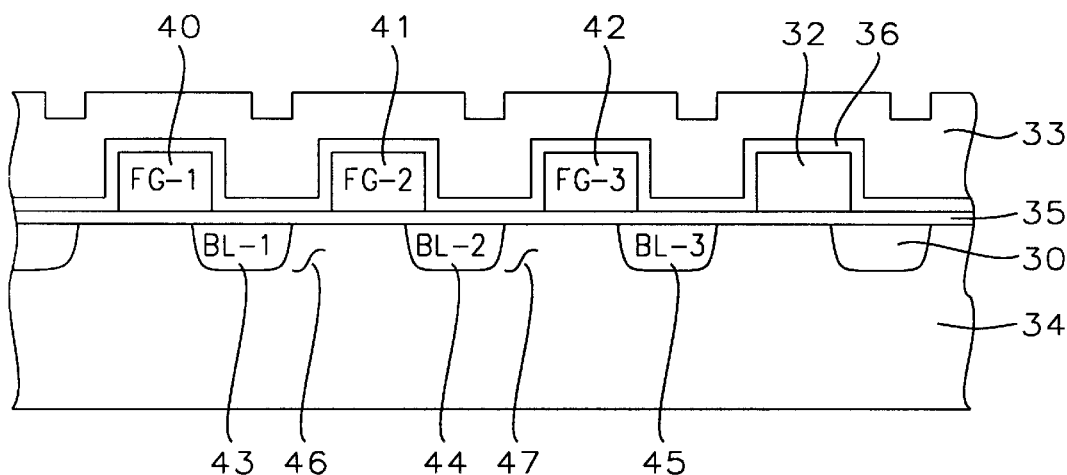
FIG. 2b, is a cross section view of a portion of flash memory cells of this invention.
FIG. 3 is a chart of voltages required to program, erase, and read the flash memory cells.

Referring to FIG. 1, two flash memory cells of prior art are shown comprising floating gates 10 and 11 separated from control gates 12 and 13 by an insulating layer of ONO (oxide-nitride-oxide) 14. A metal land 15 is connected to a drain 17 in a semiconductor substrate 18 by a metal plug 16. The size and the separation of the two flash memory cells is limited by the need to make contact from the metal land 16 to the drain 17. If the spacing that is maintained between the metal plug 16 and the adjacent control gates 12 and 13 is minimal, misalignment of the metal plug 16 through the inter-metal dielectric 19 can cause electrical shorts. Therefore, a minimum spacing needs to be maintained between the metal plug 16 and the adjacent control gates 12 and 13 that restricts the size reduction of the flash memory cells.

In FIG. 2a is shown a plan view of a portion of a flash memory of this invention. Bit lines 30 are buried into a semiconductor substrate 34 by means of imaging using photo resist or the equivalent and ion implantation. The bit lines 30 lay beside columns of floating gates 31 of the flash memory and extend partially beneath each floating gate 31 and 32 in the column. Overlaying each row of floating gates is a control gate 33 extending the length of the row and forming a word line for that row. In FIG. 2b is shown the cross section view of a portion of the flash memory of this invention. The floating gates 31 are formed on the semiconductor substrate 34 over gate oxide 35. A layer of ONO separates and isolates the floating gates 31 from the control gates 33.

Continuing to refer to FIG. 2a and 2b and referring to FIG. 3, three floating gates (FG-1) 40, (FG-2) 41 and (FG-3) 42 are shown for illustrative purposes to explain FIG. 3 associated with three buried bit lines (BL-1) 43, (BL-2) 44 and (BL-3) 45 and two channel regions 46 and 47. To program cell 2 a charge is injected onto FG-2. This is done by applying a large voltage of approximately about 7 V to the control gate 33, applying a moderate voltage of approximately about 3 V to bit line BL-2, applying 0 V to bit line BL-1 and floating bit line BL-3 with the substrate 34 held at 0 V. A high current flows in the channel 46 of the transistor formed between BL-1 and BL-2 and under the control gate 33. Ionization is formed in the channel 46 near the floating gate from which hot electrons are injected into the floating gate FG-2. The bit line BL-1 acts a the source of the transistor and bit line BL-2 acts as the drain. To program cell 3 charge is injected onto floating gate FG-3. Here bit line BL-2 becomes the source and bit line BL-3 is the drain. Bit line BL-1 is left floating and charge from the hot electron effect in channel 47 is injected into floating gate FG-3. This is done by applying a high voltage of approximately about 7 V to the control gate 33, connecting 0 V to bit line BL-2 acting as a source and connecting approximately about 3 V to bit line 3 acting as a drain with the substrate 34 held at 0 V. All other bit lines intersecting and laying under control gate 33 are floating as represented by bit line BL-1.

Continuing to refer to FIG. 3 along with FIG. 2a and 2b, Flash memory cells containing floating gates FG-1, FG-2, and FG-3 are erased by applying a high voltage of approximately about 8 V to bit lines BL-1, BL-2 and BL-3 with the control gate 33 and the substrate 34 connected to 0 V. This removes charge from the floating gates by means of Fowler-Nordheim tunneling until a predetermined threshold voltage is reached which defines the cells as being erased, or not programmed. The flash memory cell containing floating gate FG-2 is read by applying a moderate voltage of approximately about 3 V to the control gate 33, applying a moderate voltage of approximately about 2 V to bit line BL-1 operating as a drain and 0 V to bit line BL-2 operating as a source. Current flows between bit lines BL-1 and BL-2 when the floating gate FG-2 has a low charge resulting in a low threshold voltage and is detected by a sense amplifier. When the charge on the floating gate FG-2 is high (programmed state) no current flows between the two bit lines BL-1 and BI-2 and into the sense amplifier. To read the cell containing FG-3 a moderate voltage of approximately about 3 V is applied to the control gate 33, bit line BL-2 now operating as a drain has a moderate voltage of approximately 2 V applied and bit line BL-3 is connected to 0 V. All other bit lines, represented by BL-1, are connected to 0 V. Current flows between bit lines BL-2 and BL-3 when the floating gate FG-3 has a low charge resulting in a low threshold voltage and is detected by a sense amplifier. When the charge on the floating gate FG-3 is high (programmed state) no current flows between the two bit lines BL-2 and BI-3 and into the sense amplifier.

Figures 4, 5:
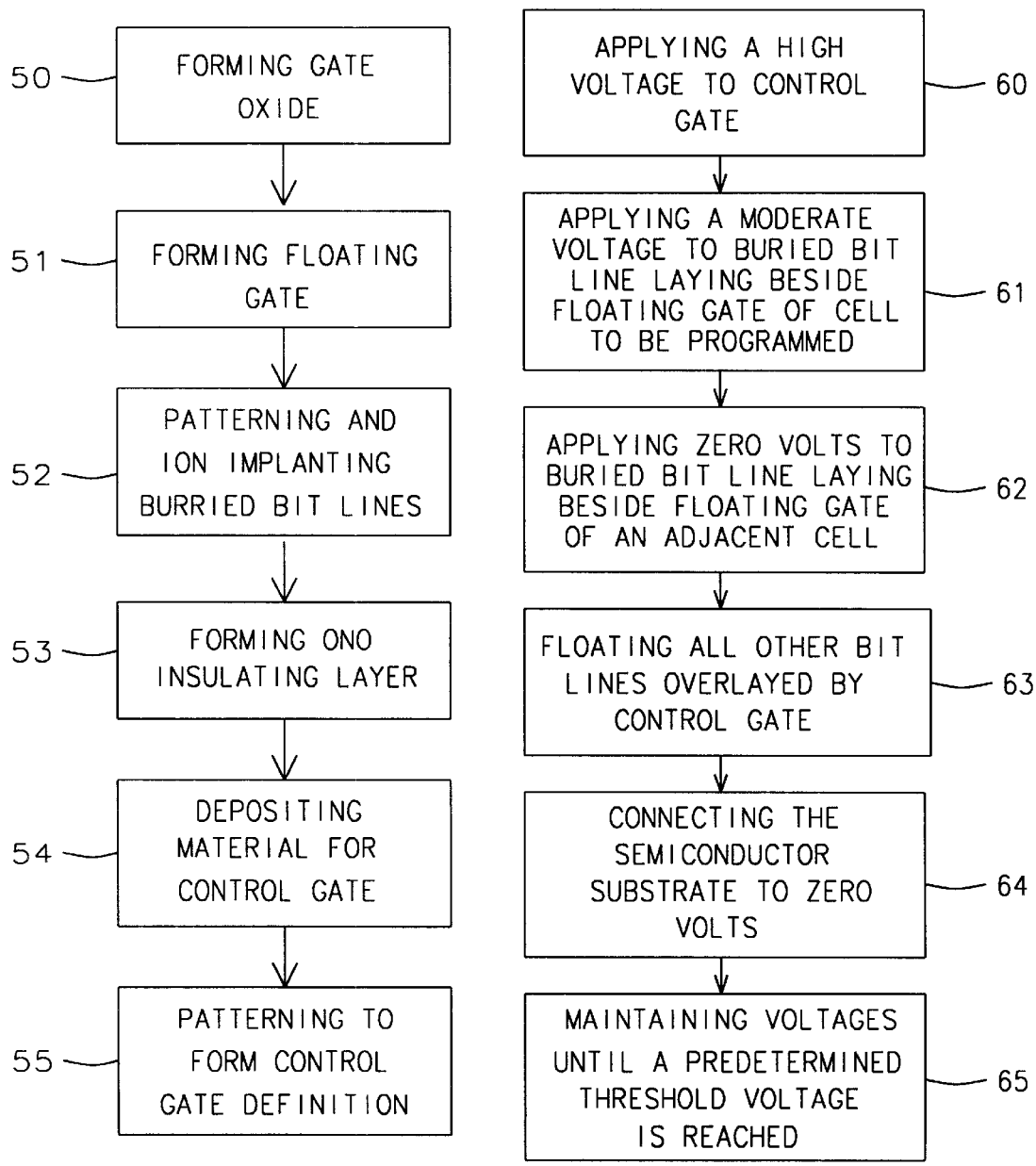
FIG. 4 is a flow diagram for forming the flash memory cells of this invention.
FIG. 5 is a flow diagram for programming a flash memory cell of this invention.

Referring to FIG. 4, a method for forming a split gate flash memory with buried bit lines is shown. A gate oxide is formed over a semiconductor substrate 50. The thickness of the gate oxide is in a range of 80 A to 100 A. An array of floating gates arranged in rows and columns are formed over the gate oxide 51. Buried bit lines are patterned and ion implanted into the semiconductor substrate along side the columns of floating gates 52. The bit lines extend partially under the columns of floating gates beside which they lay. Phosphorus ions are implanted into the substrate to form the buried bit lines having an expected energy of 40 KcV with a range of approximately about 40 KeV minimum and 60 KeV maximum. The implant dosage has an expected value of 2 E15 ions/$cm_2$ with a range of approximately about 2 E15 ions/$cm^2$ minimum and 5 E15 ions/$cm^2$ maximum. The depth of the buried bit lines is expected to be 0.3 u with a range of approximately about 0.2 u minimum and 0.4 u maximum. After the bit lines are implanted into the substrate an insulation of ONO (oxide-nitride-oxide) is formed over the surface of the substrate and the floating gates 53. Next polysilicon is deposited over the surface of the substrate 54. Control gates are patterned and formed over rows of the floating gates 55. Each row of floating gates is covered by a separate control gate that extends the full length of the row and serves as a word line for the split gate flash memory.

In FIG. 5 is shown the method of programming a split gate flash memory cell that has bit lines buried into a semiconductor substrate. A high voltage is applied to a control gate overlaying the row containing the flash memory cell to be programmed 60. A moderate voltage is applied to a first bit line laying beside and partially under the floating gate of the flash memory cell to be programmed 61. Zero volts is applied to a second buried bit line separated from the first buried bit line by the channel of the split gate transistor of the cell to be programmed and laying beside a floating gate of an adjacent flash memory cell 62. All other bit lines associated with cells overlaid by the control gate are left floating 63. The semiconductor substrate is connected to zero volts 64, and all voltages are maintained until a predetermined threshold voltage is reached for the split gate transistor being programmed 65.

In FIG. 6 is shown the method of reading a split gate flash memory cell that has bit lines buried into a semiconductor substrate. A first moderate voltage is applied to the control gate overlaying a row of split gate flash memory cells 70. Zero volts is applied to a first buried bit line laying beside and partially under the floating gate of the flash memory cell that is being read 71. A second moderate voltage lesser than the first moderate voltage is applied to a second bit line separated form the first bit line by the channel of the split gate transistor of the cell to be read and laying beside a floating gate of an adjacent flash memory cell 72. Zero volts is applied to all other bit lines associated with cells overlaid by the control gate 73, and the semiconductor substrate is connected to zero volts 74. The flash memory cell is read by detecting the conduction of current of the split gate transistor of the flash memory cell being read 75.

In FIG. 7 is shown the method of erasing split gate flash memory cells that have bit lines buried into a semiconductor substrate. A high voltage is applied to bit lines buried in a semiconductor substrate the lay beside and partially under the floating gates of the flash memory cells that are to be erased 80. Zero volts is applied to the control gate overlaying the row of flash memory cells to be erased 81, and zero volts is connected to the semiconductor substrate 82. The voltages and connections are maintained until the threshold voltage of the cells being erased fall below a predetermined voltage level 83 which defines the flash memory cells as being erased.

While the invention has been particularly shown and described with reference to preferred embodiments thereof, it will be understood by those skilled in the art the various changes in form and details may be made without departing from the spirit and scope of the invention.

What is claimed is:

1. A method of programming a flash memory cell constructed with buried bit lines used as sources and drains, comprising:
    a) applying a first positive voltage of high magnitude to a control gate overlaying a row of flash memory cells containing a first cell to be programmed,
    b) applying a second voltage of moderate magnitude to a first buried bit line laying beside and partially extending under a first floating gate of said first cell,
    c) applying zero volts to a second buried bit line laying beside and partially extending under a second floating gate of an adjacent second cell and separated from the first buried bit line by a channel length,
    d) floating all other bit lines overlaid by said control gate,
    e) connecting semiconductor substrate to zero volts,
    f) maintaining voltages and connections until a predetermined threshold voltage is reached on said cell being programmed.

2. The method of programming a flash memory cell of claim 1, wherein said second buried bit line is operating as a source providing a heavy flow of electrons from which ionized electrons are injected into said first floating gate to program said first cell.

3. The method of programming a flash memory cell of claim 1, wherein said control gate overlaying a row of flash memory cells operates as a word line.

4. A method of reading a flash memory cell constructed with buried bit lines used as sources and drains, comprising:
    a) applying a first positive voltage of moderate magnitude to a control gate overlaying a row of flash memory cells containing a first cell to be read,
    b) applying zero volts to a first buried bit line laying beside and partially extending under a first floating gate of said first cell,
    c) applying a second voltage of moderate magnitude less than said first voltage to a second buried bit line laying beside and partially extending under a second floating gate of an adjacent second cell and separated from the first buried bit line by a channel length,
    d) applying zero volts to all other bit lines laying beside memory cells overlaid by said control gate,
    e) connecting semiconductor substrate to zero volts,
    f) reading said first cell by detecting conduction of transistor of said first cell.

5. The method of reading a flash memory cell of claim 4, wherein said first buried bit line is operating as a source and said second buried bit line is operating as a drain.

6. The method of reading a flash memory cell of claim 4, wherein said control gate overlaying a row of flash memory cells operates as a word line.

7. A method of erasing a flash memory cell constructed with buried bit lines used as sources and drains, comprising:
    a) applying a high positive voltage to buried bit lines laying beside and partially under floating gates flash memory cells,
    b) applying zero volts to a control gate overlaying floating gates of cells to be erased,
    c) applying zero volts to semiconductor substrate,
    d) maintaining voltages and connections until threshold of said cells fall below a predetermined threshold voltage level.

8. The method of erasing a flash memory cell of claim 7, wherein erasing said floating gates is done by means of Fowler-Nordheim tunneling.

9. The method of erasing a flash memory cell of claim 7, wherein applying said high positive voltage to said buried bit lines erases only those cells adjacent to said buried bit lines and laying under said control gate.

* * * * *